United States Patent
Urbanek

(10) Patent No.: US 7,393,705 B1
(45) Date of Patent: Jul. 1, 2008

(54) METHODS OF FABRICATING LIGHT EMITTING DIODES THAT RADIATE WHITE LIGHT

(75) Inventor: Wolfram Urbanek, San Jose, CA (US)

(73) Assignee: Allegis Technologies, Inc., Cupertino, CA (US)

( * ) Notice: Subject to any disclaimer, the term of this patent is extended or adjusted under 35 U.S.C. 154(b) by 226 days.

(21) Appl. No.: 11/357,808

(22) Filed: Feb. 16, 2006

Related U.S. Application Data

(63) Continuation of application No. 10/892,525, filed on Jul. 14, 2004, now Pat. No. 7,015,117.

(60) Provisional application No. 60/492,720, filed on Aug. 4, 2003, provisional application No. 60/492,713, filed on Aug. 4, 2003, provisional application No. 60/489,350, filed on Jul. 22, 2003, provisional application No. 60/487,896, filed on Jul. 14, 2003, provisional application No. 60/487,417, filed on Jul. 14, 2003.

(51) Int. Cl.
*H01L 21/00* (2006.01)
(52) U.S. Cl. .............................. 438/22; 438/26; 438/483
(58) Field of Classification Search ................... 438/22, 438/26, 483
See application file for complete search history.

(56) References Cited

U.S. PATENT DOCUMENTS

| | | | | |
|---|---|---|---|---|
| 6,071,795 A | * | 6/2000 | Cheung et al. | 438/458 |
| 6,113,685 A | * | 9/2000 | Wang et al. | 117/3 |
| 6,261,931 B1 | * | 7/2001 | Keller et al. | 438/492 |
| 6,335,263 B1 | * | 1/2002 | Cheung et al. | 438/455 |
| 6,344,404 B1 | * | 2/2002 | Cheung et al. | 438/513 |
| 6,365,429 B1 | * | 4/2002 | Kneissl et al. | 438/46 |
| 6,420,242 B1 | * | 7/2002 | Cheung et al. | 438/458 |
| 6,448,102 B1 | * | 9/2002 | Kneissl et al. | 438/46 |
| 6,559,075 B1 | * | 5/2003 | Kelly et al. | 438/795 |
| 6,677,173 B2 | * | 1/2004 | Ota | 438/22 |
| 6,740,604 B2 | * | 5/2004 | Kelly et al. | 438/795 |
| 6,744,196 B1 | * | 6/2004 | Jeon | 313/498 |
| 6,794,276 B2 | * | 9/2004 | Letertre et al. | 438/506 |
| 6,958,093 B2 | * | 10/2005 | Vaudo et al. | 117/90 |
| 7,015,117 B2 | * | 3/2006 | Urbanek | 438/458 |
| 2001/0055324 A1 | * | 12/2001 | Ota | 372/43 |
| 2002/0068201 A1 | * | 6/2002 | Vaudo et al. | 428/704 |
| 2004/0029359 A1 | * | 2/2004 | Letertre et al. | 438/458 |
| 2005/0026394 A1 | * | 2/2005 | Letertre et al. | 438/459 |
| 2005/0042845 A1 | * | 2/2005 | Urbanek | 438/483 |
| 2007/0295952 A1 | * | 12/2007 | Jang et al. | 257/15 |

\* cited by examiner

*Primary Examiner*—Laura M Schillinger
(74) *Attorney, Agent, or Firm*—David H. Jaffer; Pillsbury Winthrop Shaw Pittman LLP

(57) ABSTRACT

A method for fabricating an LED that radiates white spectrum light. A phosphor that radiates a white spectrum after excitation in the blue or UV spectrum is uniformly deposited onto a GaN epitaxial wafer prior to die separation and packaging. This allows wafer-level processing and probing of white LEDs and produces true white LED chips.

17 Claims, 8 Drawing Sheets

METHODS OF FABRICATING LIGHT EMITTING DIODES THAT RADIATE WHITE LIGHT

CROSS REFERENCE TO RELATED APPLICATIONS

The present application is a continuation of U.S. Patent Application Ser. No. 10/892,525, filed on Jul. 14, 2004, which claims priority from U.S. Provisional Patent Applications including the following serial numbers: Ser. No. 60/492,720 field Aug. 4, 2003; Ser. No. 60/489,350 filed Jul. 22, 2003; Ser. No. 60/487,896 filed Jul. 14, 2003; Ser. No. 60/492,713 filed Aug. 4, 2003; and Ser. No. 60/487,417 filed Jul. 14, 2003. The disclosure of these applications is incorporated herein by reference.

BACKGROUND OF THE INVENTION

1. Field of the Invention

The present invention relates generally to the field of high power light emitting diodes, and more particularly to white gallium nitride diodes.

2. Description of the Prior Art

Gallium nitride (GaN) based light emitting diodes (LEDs) are an important source of solid state lighting in the UV through green portion of the spectrum. A white spectrum LED cannot be generated directly from GaN material, nor any other know semiconductor. The current method, therefore, for generating solid state white light consists of fabricating a blue or UV GaN LED chip and applying a variety of phosphors (e.g. Yitrium Aluminum Garnet—YAG) on top of the chip during packaging. The phosphor absorbs the blue or UV chip radiation, and re-radiates a white spectrum radiation.

The composition, thickness and uniformity of the phosphor layer are critical in determining the quality of the resulting white light, including such parameters as brightness, Color Rendering Index (CRI) and color temperature. This conventional approach of applying the phosphor during packaging significantly complicates the packaging process, and limits the use of solid state white light sources. Furthermore, over time the phosphor layer often interacts with the GaN chip, the wire bonds, or the epoxy used to encapsulate the LED package, resulting in degradation over time and reduced lifetimes.

SUMMARY

Briefly, a preferred embodiment of the present invention includes a chip-level (as opposed to packaging level) solution. A GaN film is epitaxially grown on a sapphire substrate. The film is then patterned, in a combination of film etching and metal and/or dielectric depositions. In one embodiment, the pattern GaN film is transferred from the sapphire substrate to an electrically conducting substrate. The phosphor layer is added either before or after the GaN film is transferred to the conducting substrate, but it is applied prior to chip separation (wafer dicing). In another embodiment, a support wafer (silicon, sapphire, metal, or other material) is either temporarily or permanently bonded to the GaN film using any variety of dissolvable or permanent adhesion layers (e.g., photoresist, wax, organic glue, metal solder). Alternately, the support wafer may be deposited via evaporation, sputtering, plating, or other deposition techniques. This support wafer may act as a mechanical support, an electrical contact to the epi, an optical path for the light emitting from the epi, or a combination of all three.

A laser beam of appropriate energy and wavelength is passed through a shadow mask before passing through the sapphire and becoming absorbed in the GaN at the sapphire-GaN interface. The shadow mask is aligned to the patterned GaN film in such a way that only specific, desired portions of the film are exposed to the laser radiation. After the entire GaN-on-sapphire wafer is exposed to the laser beam in this fashion, the wafer is heated, and the sapphire is removed from the GaN film, which is still supported by the support wafer.

After appropriate cleaning and conditioning of the newly exposed GaN surface, a secondary substrate (silicon, sapphire, metal, or other material) can be, but need not be, bonded to this GaN surface, replacing the removed sapphire wafer. Alternately, the secondary substrate may be deposited via evaporation, sputtering, plating, or other deposition techniques. This secondary substrate may act as a mechanical support, an electrical contact to the epi, an optical path for the light emitting from the epi, or a combination of all three. The support wafer can now be removed, if so desired.

IN THE DRAWINGS

DETAILED DESCRIPTION OF THE PREFERRED EMBODIMENTS

In one embodiment, GaN epitaxial films grown for LED applications consist of three main, sequentially grown layers (FIG. 1), each of which can be further subdivide into numerous additional layers. The main layers consist of a moderately conductive p-doped GaN layer (1), a light emitting InGaN quantum well (either single or multiple) layer (2), and a conductive n-doped GaN layer (3). Due to the rectifying nature of the GaN p-n junction, such a GaN film can only conduct electrical current from the p-layer (1), through the quantum well (QW) layer (2), into the n-layer (3), not in the other direction. Light will emit from the QW layer only if sufficient current is passed through it, as described above. Consequently, a GaN LED device requires a contact pad to both the n- and p-layers (1,3) through which to deliver this activating current.

Figure 2:
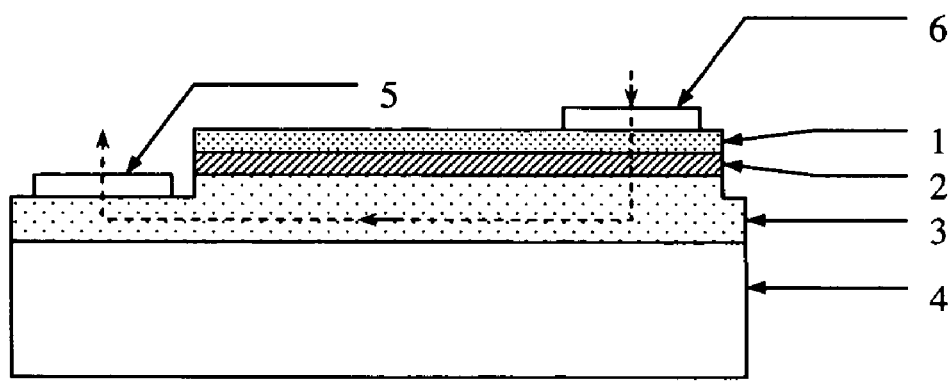
FIG. 2 illustrates a schematic of the conventional lateral GaN LED, illustrating the flow of electrical current through the device.

In the conventional GaN on sapphire LED (FIG. 2), some of the GaN must be removed to make contact to the n-layer (3) via the n-pad (5). This is the case because the sapphire (4) is not electrical conductive. The electrical current can now pass from the p-pad (6), into the p-layer (1), through the QW layer (2), through the n-layer (3), into the n-pad (5). Because the current runs laterally through the n-layer (3), this type of structure is called lateral.

GaN epitaxial films grown for LED applications consist of three main, sequentially grown layers (FIG. 1), each of which can be further subdivide into numerous additional layers. The main layers consist of a moderately conductive p-doped GaN layer (1), a light emitting InGaN quantum well (either single or multiple) layer (2), and a conductive n-doped GaN layer (3), grown onto a substrate (4), generally sapphire, but necessarily so. Due to the rectifying nature of the GaN p-n junction, such a GaN film can only conduct electrical current from the p-layer (1), through the quantum well (QW) layer (2), into the n-layer (3), not in the other direction. Light will emit from the QW layer only if sufficient current is passed through it, as described above. Consequently, a GaN LED device requires a contact pad to bht the n- and p-layers (1, 3) through which to deliver this activating current.

Figure 3:
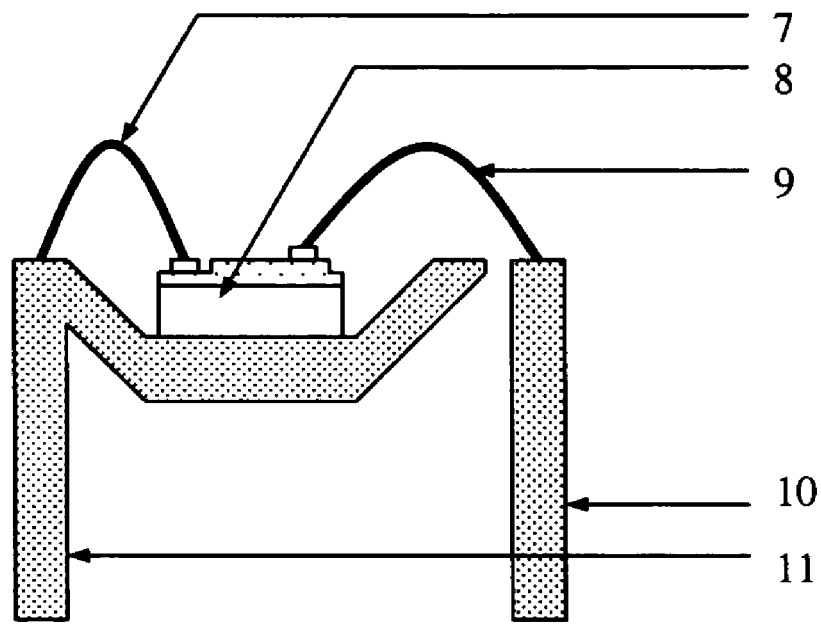
FIG. 3 illustrates a schematic of a lateral blue GaN LED chip after conventional attachment and wire bond to a lead frame.

In the conventional GaN on sapphire LED (FIG. 3), some of the GaN must be removed to make contact to the n-layer (3) via the n-pad (5). This is the case because the sapphire (4) is not electrically conductive. The electrical current can now pass from the p-pad (6), into the p-layer (1), through the QW layer (2), through the n-layer (3), into the n-pad (5). Because the current runs laterally through the n-layer (3), this type of structure is called lateral.

Figure 4:
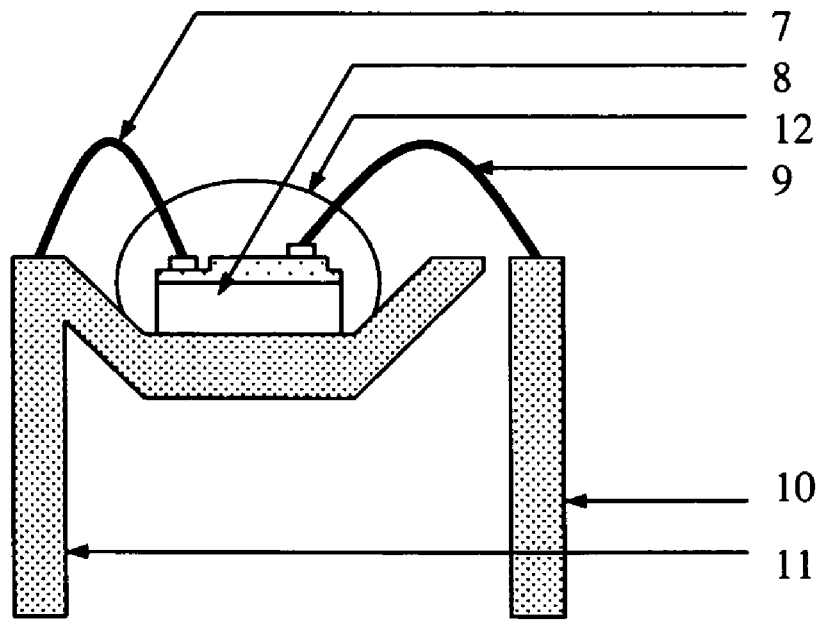
FIG. 4 illustrates a schematic of a partially packaged lateral blue GaN LED chip after conventional deposition of phosphor layer to convert the chip's blue spectrum to white.
Figure 5:
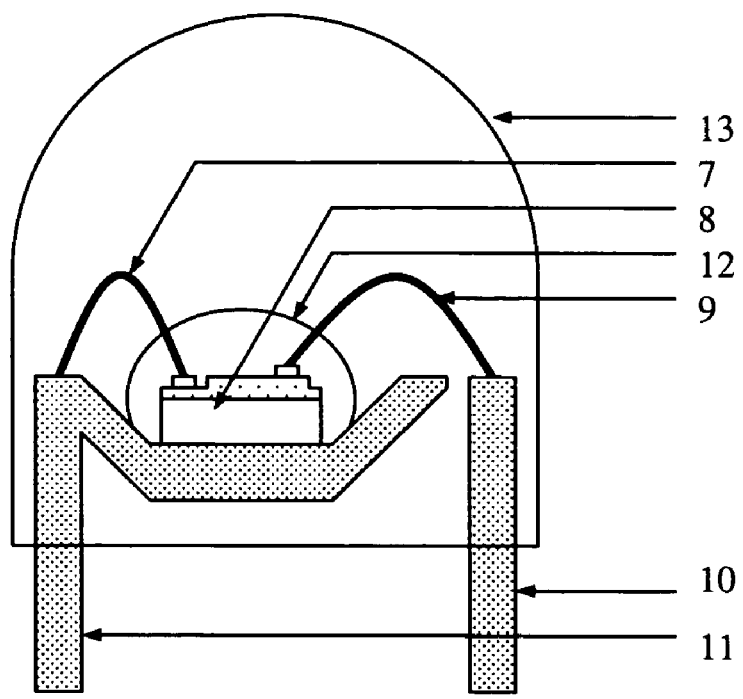
FIG. 5 illustrates a schematic of a completely packaged lateral blue GaN LED demonstrating the conventional white packaging method.

FIG. 4 shows a blue lateral GaN LED chip (8) after chip attach and wire bond to a standard lead frame. There are two wire bonds, namely the n wire bond (7) connecting the n-pad to the n-lead (11) and the p wire bond (9) connecting the p-pad to the p-lead (10). In order to create a white LED lamp, the blue GaN chip (8) is coated with a drop of phosphor impregnated epoxy (12), as shown in FIG. 4. In the final packaging step (FIG. 5), the chip (8), wire bonds (7, 9), and phosphor layer (12) are encapsulated in an epoxy lens (13).

Figure 6:
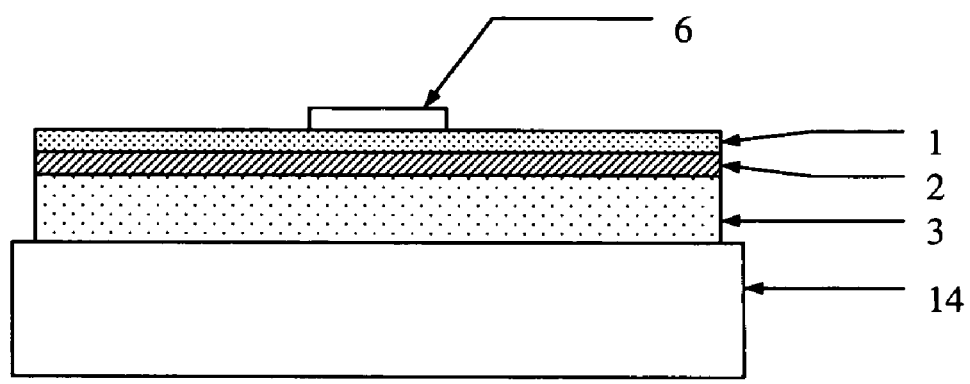
FIG. 6 illustrates a schematic of a vertical blue GaN LED chip.

A more efficient, both electrically and thermally, blue GaN LED structure is shown in FIG. 6. The sapphire substrate has been replaced with an electrically and thermally conductive substrate (14), which allows both electrical current and heat to flow vertically through the device. Since the current now flows vertically from the p-pad (6), through the p-layer (1), the QW layer (2), the n-layer (3), and into the substrate (14), which doubles as the n-pad, this is known as a vertical device structure.

Figure 7:
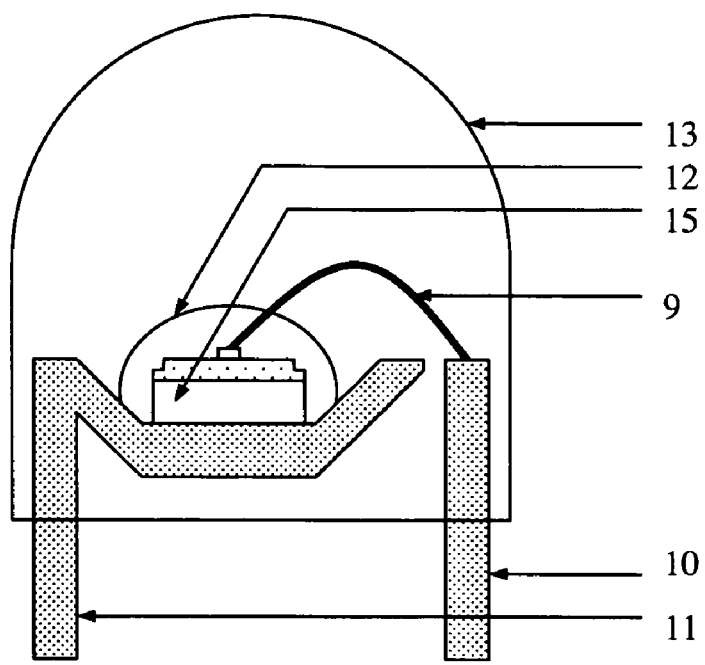
FIG. 7 illustrates a schematic of a completely packaged vertical blue GaN LED demonstrating the conventional white packaging method.
Figure 18:
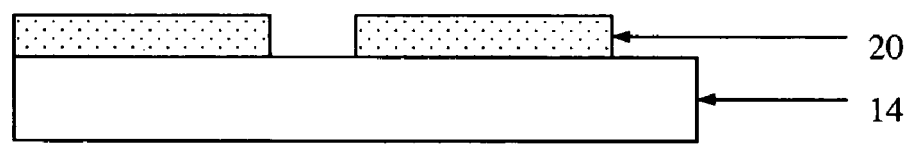
Figure 19:
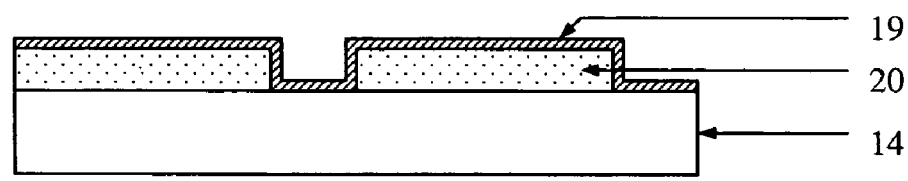
Figure 20:
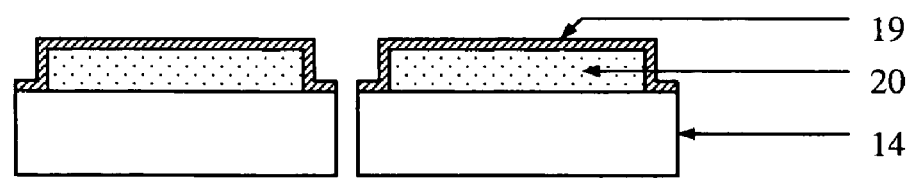

FIG. 7 shows a blue vertical GaN LED chip (15), packaged as a conventional white lamp, in a manner similar to that of the lateral blue LED chip (8) of FIG. 18. Since the chip substrate is now the N-pad, only the p wire bond (9) is required, simplifying packaging somewhat. However, since the chip (15) is blue, the phosphor layer (12) is still necessary.

Figure 8A:
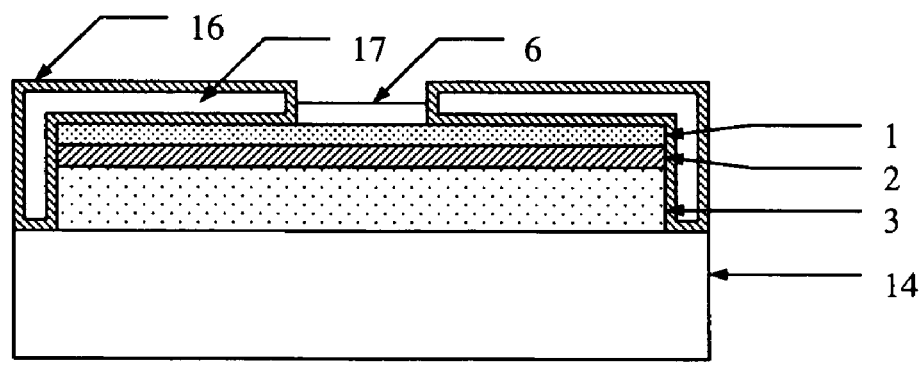
FIG. 8a illustrates a schematic of a vertical white GaN LED chip, as embodied in the invention.
Figure 9:
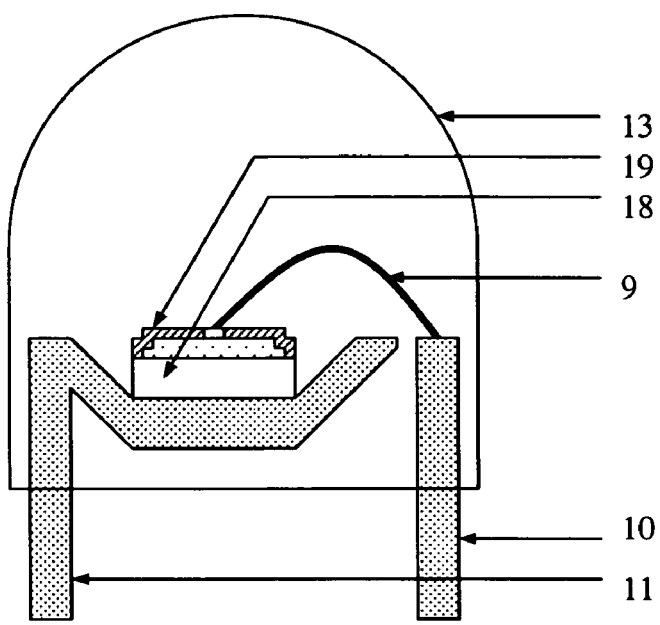
FIG. 9 illustrates a schematic of a completely packaged vertical white GaN LED, as embodied in the invention.
Figure 10:
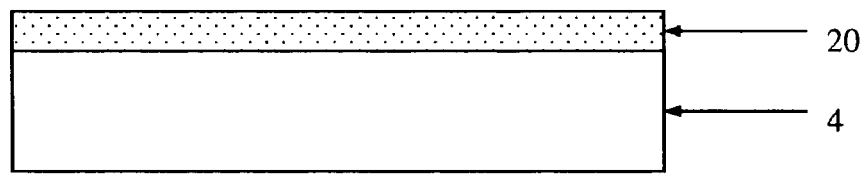
FIGS. 10-20 illustrate a schematic of the process of a vertical white GaN LED chip, as embodied in the invention.

FIG. 8a shows a white vertical GaN LED chip as embodied in the invention. All layers are identical to those of FIG. 6, except for the addition of the phosphor layer (17), and the passivation layer (16). The passivation layer isolates the phosphor from both the GaN chip, and the ambient environment. FIG. 9 shows the white vertical chip (18) packaged as a white lamp as embodied in the invention. No phosphor layers are introduced during the packaging process, since this layer already exists on the chip.

Figure 1:
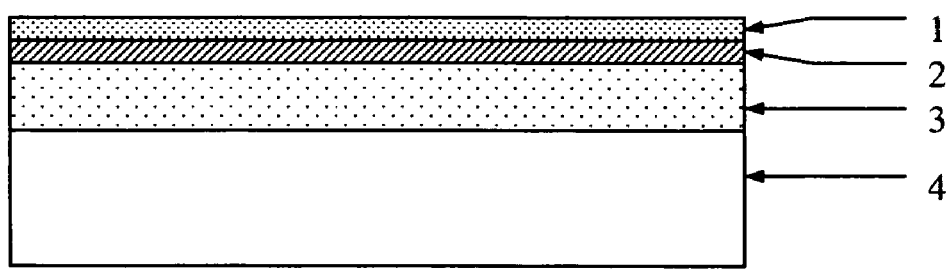
FIG. 1 illustrates a schematic of the GaN epitaxial layers for LED applications.

The process required to fabricate the white GaN LED chip is shown schematically in FIGS. 10-20. First, GaN epitaxial layers described in FIG. 1 are grown on sapphire. For simplicity, layers (1), (2), and (3) of FIG. 1 have been combined into one layer (2) in FIG. 10.

Figure 11:
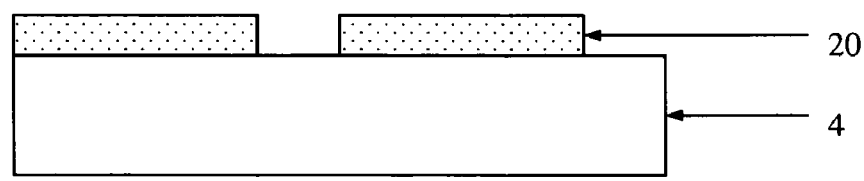

After GaN epitaxy, the GaN layer is patterned through both GaN etching and various depositions (metal, dielectrics) and alloying steps. These steps produce the p-contact of FIG. 6, and fabricate features that aid in subsequent film delamination and dicing steps. FIG. 11 illustrates two LED structures patterned into GaN Layer (2) on sapphire (4). Depending on the size of each device, each sapphire wafer would contain several thousands of LED devices.

Figure 12:
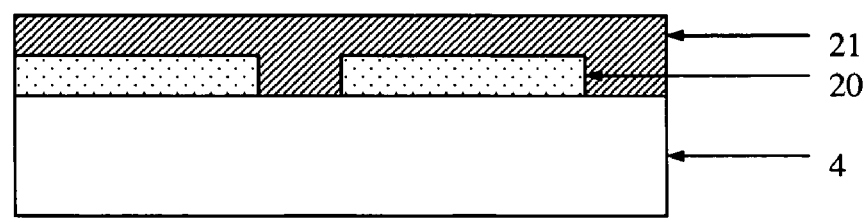

Next, an adhesion layer (21) is deposited on the GaN surface (see FIG. 12). This layer can consist of several different types of material, such as thick photoresists, spin-on glass, epoxies, organic glues, and waxes. For subsequent process flexibility, the adhesion layer should be temporary, and easily removed upon process completion. This requirement makes photoresists, organic glues, and waxes particularly attractive. The preferred of adhesion layer deposition is spin coating, as this produces a uniform, repeatable, bubble free layer if properly performed.

Figure 13:
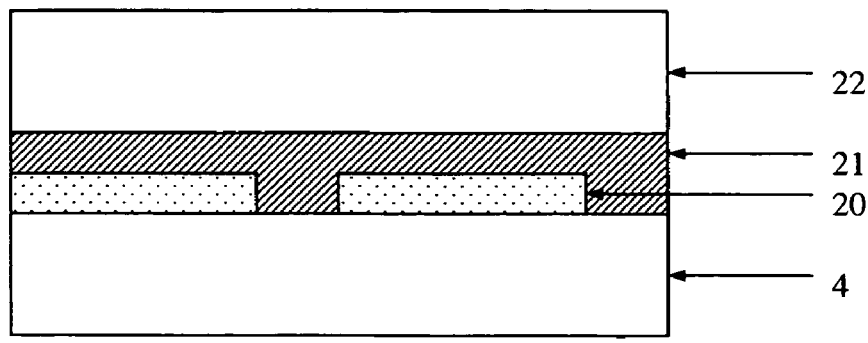

With the appropriate adhesion layer in place, but not yet cured, a support wafer (22) is attached in FIG. 13. This assembly is then cured through a combination of time and temperature, with care being taken to allow for subsequent removal of the support wafer. The support wafer needs to be sufficiently stiff to allow handling after removal of the sapphire wafer. Also, researchers at University of California have found that matching the mechanical stiffness of the support wafer to that of the GaN film is useful in reducing damage to the GaN during sapphire removal.

The wafer is then selectively exposed to laser radiation (see FIG. 14) with wavelength energies lower than the bandgap of sapphire (9 eV) but higher than the bandgap of GaN (3.4 eV), which restricts the wavelengths between 138 nm and 364 nm. At these wavelengths, the laser passed through the sapphire with minimal absorption, but is maximally absorbed in the GaN without penetrating significantly into the GaN film. For the embodiment of this invention, a 248 nm KrF excimer laser is used, since these lasers are commercially available with sufficiently high power densities. Beam power densities above >600 mJ/cm$^2$ are required to decompose the GaN into gallium and nitrogen at the GaN—sapphire interface.

Figure 14:
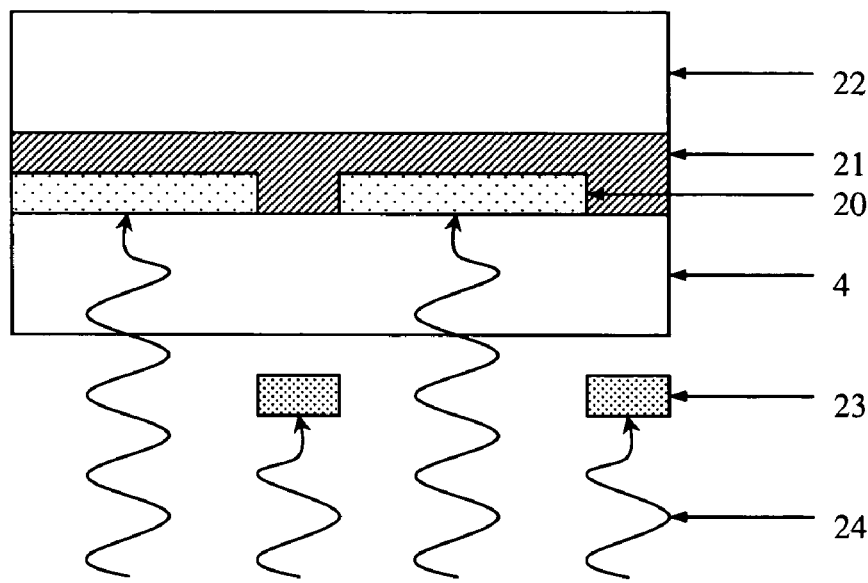

As seen in FIG. 14, a shadow mask (23), carefully aligned to the patterned GaN (20), is used to block the laser beam (24) from hitting areas where the GaN has been removed during earlier processing. This is critical, since exposing the adhesion layer (21) directly to the laser beam can cause the layer to weaken, thereby causing support wafer (22) delamination and GaN film cracking.

Figure 21:
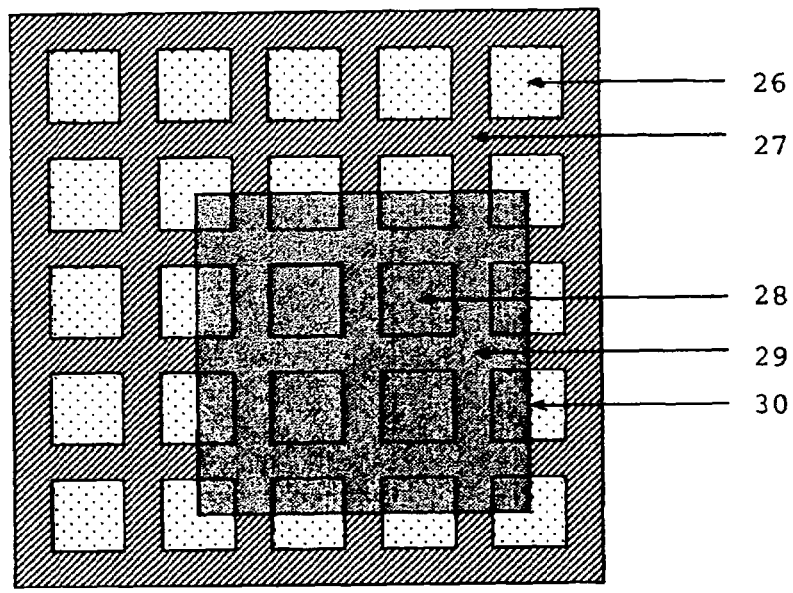
FIG. 21 illustrates a schematic of single laser exposure without the use of shadow mask.

FIG. 21 shows a single, unaligned laser exposure where no shadow mask is used. Features (14) and (15) represent unexposed GaN device and adhesion layer, respectively. Feature (16) represents a fully exposed and delaminated GaN device, while feature (17) represents exposed, and consequently weakened, adhesion layer. The boundary of exposure, where high stresses are located in the GaN film, is shown by (18). Features such as (17) are unavoidable without use of a shadow mask in conjunction with the exposing laser beam, as described in the invention.

Figure 22:
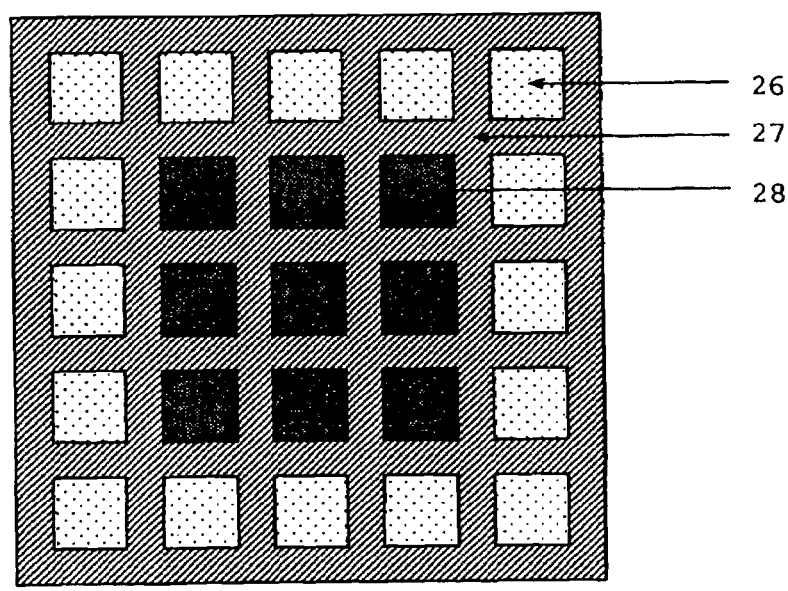
FIG. 22 illustrates a schematic of single laser exposure with the use of shadow mask.

As embodied in this invention, however, selective laser exposure ensures that all GaN devices within an exposure area are fully delaminated, and that the adhesion layer between adjacent GaN dies is not weaken and can absorb the stresses at the exposure boundary. FIG. 22 shows a single laser exposure patterned using a shadow mask. Also shown are an unexposed GaN device (14), unexposed adhesion layer (15), and a fully exposed GaN device (16). In contrast to FIG. 21, there are no regions of exposed adhesion layer. If necessary, a wide adhesion layer filled trench can be incorporated on the GaN wafer to accommodate the delamination boundary of each laser exposure, further reducing any potential cracking due to stress buildup at these boundaries.

Figure 15:
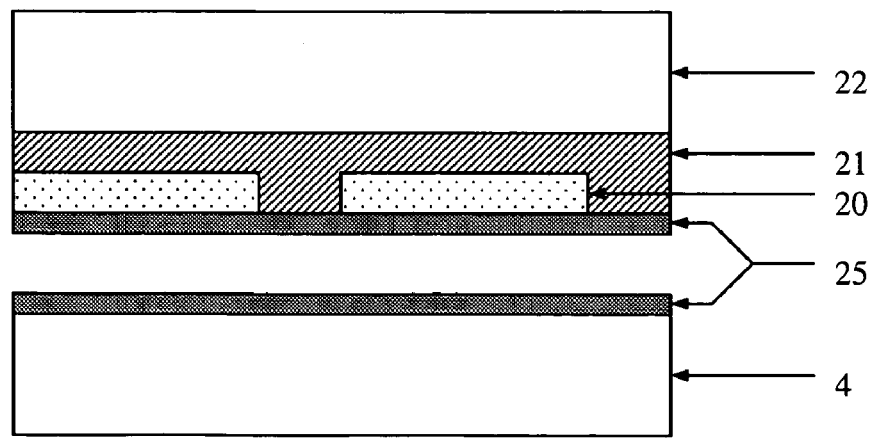
Figure 16:
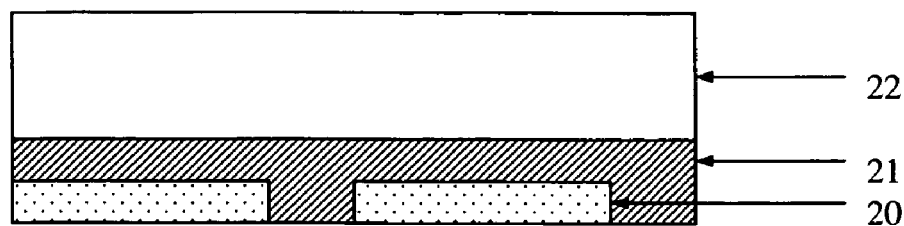

After the entire wafer has been exposed to the laser radiation, the wafer is heated to slightly above 30 C, and the sapphire growth wafer can now be removed. FIG. 15 shows the delaminated sapphire wafer (4) and the GaN layer (20) bonded to the support wafer 22. A thin film of Ga (25) will remain on both newly exposed surfaces after delamination, but this reside can easily be removed with a 10 sec HCl:$H_2O$ (1:1) dip. Such a cleaned wafer is shown in FIG. 16.

Figure 17:
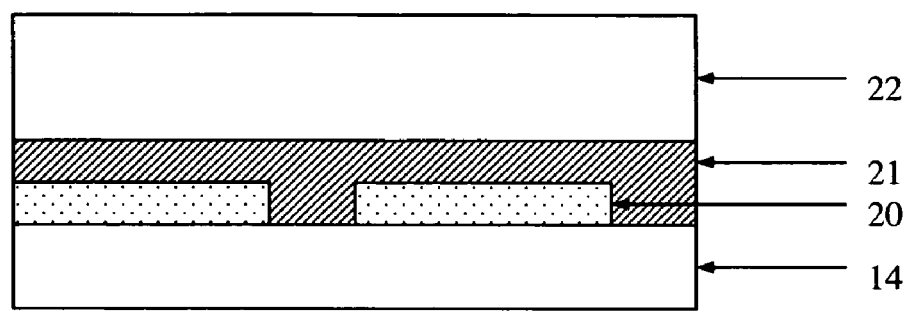

The secondary substrate (14) of FIG. 17 may now be deposited onto the exposed GaN film (20). There are numerous methods of depositing this substrate, as there are numerous substrate materials. A sample process is the electron-beam evaporation of a thin contact layer consisting of Ti/Al (50Å/4000 Å), followed by a thin Cr/Au (500Å/10,000 Å) layer to present corrosion of the Ti/Al. A thick (50-100 um) layer of metal may now be plated onto the wafer. Metal choice depends on the application, but Cu is a good choice for electrical and thermal properties.

Finally, the support wafer (22) of FIG. 17 may be removed by submersing the wafer in an appropriate solvent, usually acetone, in order to dissolve the adhesion layer (21). The resulting wafer structure is shown in FIG. 18. At this point, each LED chip on the wafer may be electrically and optically probed. An important parameter to measure is the peak wavelength of each device, since the average wavelength of the wafer will determined the subsequent phosphor layer composition and thickness.

Next, as embodied in the invention, the passivation-phosphor-passivation layers (16,17) described in FIG. 8a are deposited. For simplicity, these layers have been combined into a single layer (19) of FIG. 19. Both the passivation and the phosphor are deposited by low temperature plasma enhanced chemical vapor deposition (PECVD). An alternate embodiment of the invention includes depositing the passivation-phosphor-passivation layers earlier in the wafer process, before laser lift off and substrate transfer, in the steps described in FIG. 11. The benefit of earlier deposition is that higher deposition temperatures may be used, potentially improving the layer quality. A benefit of later deposition, as described earlier, is that the wafer may be probed prior to phosphor deposition, allowing for more accurate phosphor matching.

After the phosphor layer has been deposited and patterned to allow access to the p-pad (6) of FIG. 8a (p-pad not shown in FIGS. 10-20), the wafer may be probed again, this time to measure the white spectrum of each chip. After probing, the wafer is diced, resulting in the separated chips of FIG. 20. The chips are now ready for packaging, as described in FIG. 9.

Figure 8B:
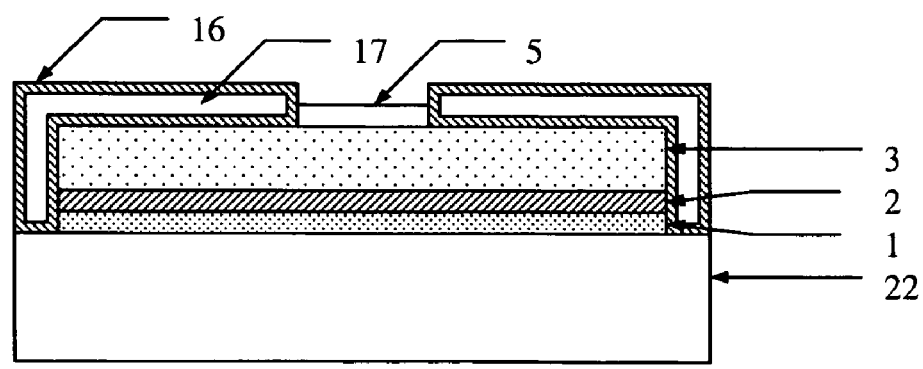
FIG. 8b illustrates a schematic of a vertical white GaN LED chip, as an alternate embodiment of the invention.

An alternate embodiment of the invention is to bond or deposit a permanent support wafer prior to laser delamination, instead of the temporary support wafer described above. This permanent support wafer will be used as a mechanical support, an electrical contact to the epi, and either an optical path for or a reflector of the light emitting from the epi. In this embodiment, the secondary substrate is not needed, but is replaced by a N-type bond pad, usually, but not necessarily composed of a thin contact layer consisting of Ti/Al (50Å/4000 Å), followed by a Cr/Au (500 Å/15,000 Å) layer to prevent corrosion of the Ti/Al and allow wirebonding. A drawing of an individual chip form in this embodiment is shown in FIG. 8b, where (22) is the support wafer (doubling as the p-pad), (5) is the n-pad, (1) is the p-layer of the epi, (2) is the QW layer of the epi, (3) is the n-layer of the epi, (17) is the phosphor layer, and (16) is the passivation layer.

While a particular embodiment of the present invention has been shown and described, it will be obvious to those skilled in the art that changes and modifications may be made without departing from the spirit of the present invention, and therefore the appended claims are to include these changes and alterations as follow within the true spirit and scope of the present invention.

What is claimed is:

1. A method for producing gallium nitride light emitting diodes comprising the steps of:
    (a) growing a gallium nitride epitaxial layer on a top surface of a sapphire substrate;
    (b) patterning the gallium nitride layer to selectively form a plurality of dies separated by trenches;
    (c) coating the gallium nitride layer with a phosphor layer that absorbs blue or UV radiation and re-emits radiation to produce a desired spectrum of light;
    (d) attaching a support structure to the gallium nitride layer with a procedure that includes filling the trenches;
    (e) irradiating the bottom surface of the sapphire substrate with a plurality of pulses of laser radiation having a wavelength that is substantially absorbed by the gallium nitride near the interface of the gallium nitride layer and the sapphire substrate, wherein the laser radiation is patterned so that
        (i) the laser radiation reaches areas where the gallium nitride and sapphire substrate interface and does not reach the filled trenches, whereby the gallium nitride and sapphire delaminate to create an exposed gallium nitride layer,
        (ii) the laser radiation is shaped to prevent partial irradiation of a die; and
        (iii) the pulses of laser radiation are moved across the gallium nitride layer in a manner that avoids substantial overlap of pulses of laser radiation; and
    (f) removing the sapphire substrate.

2. The method of claim 1, wherein the support structure includes an adhesive layer that contacts the gallium nitride layer and fills the trenches.

3. The method of claim 2, wherein the support structure includes a second support layer that attaches to the adhesive layer.

4. The method of claim 1, further comprising the step of depositing a secondary substrate onto the exposed gallium nitride layer.

5. The method of claim 4, wherein the secondary substrate is electrically conductive.

6. The method of claim 4, further comprising the step of removing the support structure.

7. The method of claim 4, wherein the secondary substrate includes a thermal dissipation layer including a metal.

8. The method of claim 4, wherein the secondary substrate includes a first contact layer that contacts the gallium nitride layer, the first contact layer including a metal selected from the group consisting of titanium, aluminum, and silver.

9. The method of claim 7, wherein the secondary substrate includes a first contact layer that contacts the gallium nitride layer, the first contact layer including a metal selected from the group consisting of titanium, aluminum, and silver.

10. The method of claim 9, wherein the secondary substrate includes a second contact layer between the first contact layer and the thermal dissipation layer.

11. The method of claim 10, wherein the second contact layer includes a metal selected from the group consisting of chromium and gold.

12. The method of claim 7, wherein the thermal dissipation layer includes a metal selected from the group consisting of copper, aluminum, silver, and gold.

13. The method of claim 4, wherein the support structure includes an adhesive layer that contacts the gallium nitride layer and fills the trenches.

14. The method of claim 4, wherein the support structure includes a second support layer that attaches to the adhesive layer.

15. The method of claim 4, further comprising the step of removing the support structure.

16. The method of claim 1, wherein the phosphor layer is applied after the patterning step and before the support structure attaching step.

17. The method of claim 1, wherein the phosphor layer is applied after the sapphire substrate removing step.

* * * * *